(12) United States Patent
Tomar et al.

(10) Patent No.: US 7,802,219 B2
(45) Date of Patent: Sep. 21, 2010

(54) FLAT PLACEMENT OF CELLS ON NON-INTEGER MULTIPLE HEIGHT ROWS IN A DIGITAL INTEGRATED CIRCUIT LAYOUT

(75) Inventors: Anurag Tomar, San Jose, CA (US); Dave Noice, Palo Alto, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 186 days.

(21) Appl. No.: 11/565,476

(22) Filed: Nov. 30, 2006

(65) Prior Publication Data

US 2008/0134118 A1 Jun. 5, 2008

(51) Int. Cl.
*G06F 17/50* (2006.01)

(52) U.S. Cl. .................. 716/10; 716/1; 716/2; 716/8; 716/9; 716/11

(58) Field of Classification Search .............. 716/2, 716/8–11
See application file for complete search history.

(56) References Cited

U.S. PATENT DOCUMENTS

| | | | | |
|---|---|---|---|---|
| 6,249,902 B1 * | 6/2001 | Igusa et al. | ................... | 716/10 |
| 6,256,768 B1 * | 7/2001 | Igusa | ........................ | 716/11 |
| 6,370,673 B1 * | 4/2002 | Hill | ............................ | 716/2 |
| 6,519,745 B1 * | 2/2003 | Srinivas et al. | ................ | 716/5 |
| 6,629,308 B1 * | 9/2003 | Baxter | ......................... | 716/16 |
| 6,725,185 B2 * | 4/2004 | Clement | ...................... | 703/14 |
| 6,792,585 B1 * | 9/2004 | Ku et al. | ....................... | 716/10 |
| 6,886,148 B2 * | 4/2005 | Solomon | ...................... | 716/11 |
| 7,005,888 B1 * | 2/2006 | Baxter | ......................... | 326/41 |
| 7,024,419 B1 * | 4/2006 | Klenk et al. | ................. | 707/102 |
| 7,089,521 B2 * | 8/2006 | Kurzum et al. | ................ | 716/10 |
| 7,124,377 B2 * | 10/2006 | Catthoor et al. | ................ | 716/2 |
| 7,334,209 B1 * | 2/2008 | Roberts et al. | ................ | 716/11 |
| 7,401,310 B1 * | 7/2008 | Thaden et al. | ................. | 716/6 |
| 2005/0166169 A1 * | 7/2005 | Kurzum et al. | ................ | 716/10 |
| 2008/0178135 A1 * | 7/2008 | Wu et al. | ........................ | 716/8 |
| 2008/0216040 A1 * | 9/2008 | Furnish et al. | ................ | 716/10 |
| 2009/0254874 A1 * | 10/2009 | Bose | ............................. | 716/6 |

OTHER PUBLICATIONS

Sarrafzadeh et al.; "NRG: global and detailed placement"; Nov. 9-13, 1997; Computer-Aided Design, 1997. Digest of Technical Papers., 1997 IEEE/ACM International Conference on; pp. 532-537.*

(Continued)

*Primary Examiner*—Helen Rossoshek
(74) *Attorney, Agent, or Firm*—McDermott Will & Emery LLP

(57) ABSTRACT

The various embodiments of the present invention generally relate to systems, methods, and computer program products for placement of at least one cell in a digital integrated circuit layout. A global placement grid of coordinates is formed, where the coordinates represent horizontal and vertical directions. A local placement grid of coordinates is also formed for at least one local region, where the local placement grid of coordinates represent horizontal and vertical directions, and where the at least one local region is adapted to support non-integer multiple height rows. At least one cell is associated with the at least one local region formed, and the cell can be placed in the local placement grid of the local region.

15 Claims, 4 Drawing Sheets

OTHER PUBLICATIONS

Blanks; "Near-Optimal Placement Using a Quadratic Objective Function"; Design Automation, 1985. 22nd Conference on Jun. 23-26, 1985 pp. 609-615.*

Hur et al.; "Mongrel: hybrid techniques for standard cell placement"; Nov. 5-9, 2000; Computer Aided Design, 2000. ICCAD-2000. IEEE/ACM International Conference on; pp. 165-170.*

* cited by examiner

FLAT PLACEMENT OF CELLS ON NON-INTEGER MULTIPLE HEIGHT ROWS IN A DIGITAL INTEGRATED CIRCUIT LAYOUT

STATEMENT REGARDING FEDERALLY SPONSORED RESEARCH OR DEVELOPMENT

Not Applicable.

FIELD OF THE DISCLOSURE

The present invention generally relates to the field of electronic circuit design tools. In particular, the present invention relates to systems, methods, and computer program products for flat placement of cells on Non-Integer Multiple Height (NIMH) rows in a digital integrated circuit layout.

BACKGROUND

Digital integrated circuits contain many electronic components such as transistors, resistors, and capacitors. It is advantageous to partition the design of the digital integrated circuit, where certain circuit components are grouped together and can be reused repeatedly through the digital integrated circuit or subsequent designs. These groupings of components ("cells") are often incorporated into various digital libraries that can be utilized with electronic circuit design software. Each library can have component groups that utilize different voltage, power, or speed values. In the design and layout of a digital integrated circuit, different libraries can be utilized and selected from for the necessary component groupings needed for a design. However, the component groupings in these different libraries can have cells of distinctly different heights and widths from each other.

Standard cell placement in electronic circuit design software is based on a placement grid, which has a basic grid cell of a unit size. This unit size, called a site, is based on the smallest height cell (i.e., for the height of the unit size) and the lowest orthogonal routing layer pitch distance (i.e., for the width value of the unit size). Once the basic site size is established, rows of this basic site are used to create a placement grid. Thus, placement is based on row-height, or overlapping multi-height rows, which are exact-integer multiples of a basic row.

Presently, when designing a digital integrated circuit with electronic software tools, separate base height cells are placed in separate "hierarchical" partitions. These placements must be performed during different placement sessions by an operator using the electronic circuit design software. Upon completion of these placement operations during separate sessions, these individual placements can be merged, during another separate session, as "hard blocks" at the top-level of the digital integrated circuit design. Thus, an operator of the electronic circuit design software is not able to optimize design and layout of component groupings across these hierarchies, nor is the operator able to do any other "dependent" operation, such as inserting clock trees, routing, etc.

Accordingly, what is needed are systems and methods for flat placement of cells in Non-Integer Multiple-Height (NIMH) rows in a digital integrated circuit design layout. What is additionally needed are systems and methods that allow an operator of electronic circuit design software to place different NIMH rows during the same session.

SUMMARY OF THE DISCLOSURE

The present invention addresses the above-described deficiencies of typical standard cell placement and hierarchical placement systems for digital integrated circuit layout.

At least one exemplary embodiment of the present invention relates to a method for placement of at least one cell in a digital integrated circuit layout. A global placement grid of coordinates is formed, where the coordinates represent horizontal and vertical directions. A local placement grid of coordinates is also formed for at least one local region, where the local placement grid of coordinates represent horizontal and vertical directions, and where the at least one local region is adapted to support non-integer multiple height rows. At least one cell is associated with the at least one local region formed.

According to at least one exemplary embodiment of the present invention, a computer program product comprises a medium for storing programs for execution by one or more computer systems. The computer program product has a module for placement of at least one cell in a digital integrated circuit layout, where the module is used in conjunction with at least a microprocessor unit, a memory, and a user interface. The module includes one or more computer programs containing instructions for forming a global placement grid of coordinates, where the coordinates represent horizontal and vertical directions. The module also includes instructions for forming a local placement grid of coordinates for at least one local region, where the local placement grid of coordinates represent horizontal and vertical directions, and where the at least one local region is adapted to support non-integer multiple height rows. In addition, the module include instructions for associating the at least one cell with the at least one local region formed.

At least one exemplary embodiment of the present invention relates to a system for placement of at least one cell in a digital integrated circuit layout. The system has at least one processing unit for executing computer programs, and a graphical-user-interface for viewing representations of the digital integrated circuit on a display and observing the layout of the integrated circuit. The system also includes a memory for storing databases of the digital integrated circuit. In addition, the system includes means for forming a global placement grid of coordinates, where the coordinates represent horizontal and vertical directions. Moreover, the system has means for forming a local placement grid of coordinates for at least one local region, where the local placement grid of coordinates represent horizontal and vertical directions, and where the at least one local region is adapted to support non-integer multiple height rows. Also, the placement system has means for associating the at least one cell with the at least one local region formed.

Advantages of the present invention include, but are not limited to, allowing flat placement and legalization of standard cells on Non-Integer Multiple Height (NIMH) rows in a digital integrated circuit layout during the same session, rather than over different sessions as is necessary with hierarchical design in electronic circuit design software. This can reduce the amount of area required for electronic components in the digital integrated circuit layout, improve timing, reduce power, and provide other related benefits. Another advantage of the present invention is the placement of multiple local regions, each with their own local placement grid of coordinates, within a global placement grid of coordinates for a digital integrated circuit layout. In addition, separate local regions allows for different row heights, widths, and offsets. Moreover, Non-Integer Multiple Height local groups allow for the use of cells from different libraries, substantially simultaneously, where cells from different libraries may have different voltages or other attributes. Other advantages of flat placement in exemplary embodiments of the present invention include enabling clock tree synthesis to insert clocks on the entire digital integrated circuit design layout at the same time, permitting access to all route information on top of each different region within the digital integrated circuit, and other similar advantages.

It is understood that other embodiments of the present invention will become readily apparent to those skilled in the art from the following detailed description, wherein it is shown and described only various embodiments of the invention by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Referring now to the drawings in which like reference numbers represent corresponding parts throughout.

DETAILED DESCRIPTION OF THE DISCLOSURE

The various embodiments of the present invention generally relate to placement of cells within a local region which has a local placement grid of coordinates separate from a global placement grid of coordinates for a digital integrated circuit layout.

Figure 1:
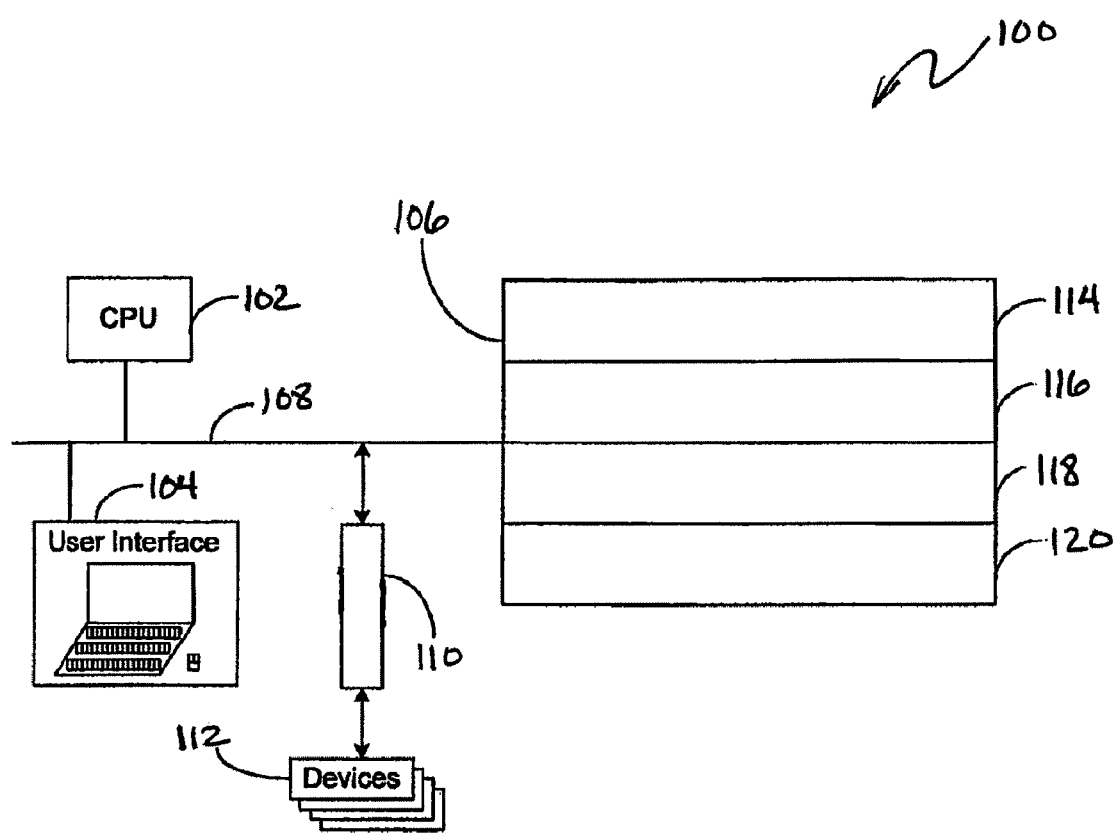
FIG. 1 illustrates an implementation of flat placement of cells on non-integer multiple height rows using a computer system according to various exemplary embodiments of the present invention.

In various embodiments of the present invention, digital integrated circuit layout design software is implemented using computer system 100 schematically shown in FIG. 1. The computer system includes one or more central processing units (CPUs) 102, at least user interface 104, memory device 106, system bus 108, and one or more bus interfaces for connecting the CPU, user interface, memory device, and system bus together. Computer system 100 also includes at least one network interface 110 for communicating with other devices 112 on a computer network. In alternative embodiments, much of the functionality of the digital integrated circuit layout system may be implemented in one or more application-specific integrated circuits (ASICs) or field-programmable gate arrays (FPGAs), thereby either eliminating the need for a CPU, or reducing the role of the CPU.

Memory device 106 may include high-speed random-access memory and may also include non-volatile memory, such as one or more magnetic disk storage devices. Memory device 106 may also include mass storage that is remotely located from CPU(s) 102. Memory device 106 preferably stores: an operating system 114 that includes procedures for handling various basic system services and for performing hardware-dependent tasks; databases 116 for storing information related to the digital integrated circuit, such as component or device group (i.e., cell) libraries; application programs 118 for performing other user-defined applications and tasks; and placement module 120 for placement of at least one cell in a local region of a digital integrated circuit layout.

Database 116, application programs 118, and placement module 120 may include executable procedures, sub-modules, tables, and other data structures. In other embodiments, additional or different modules and data structures may be used, and some of the modules or data structures listed above may not be used.

Figure 2:
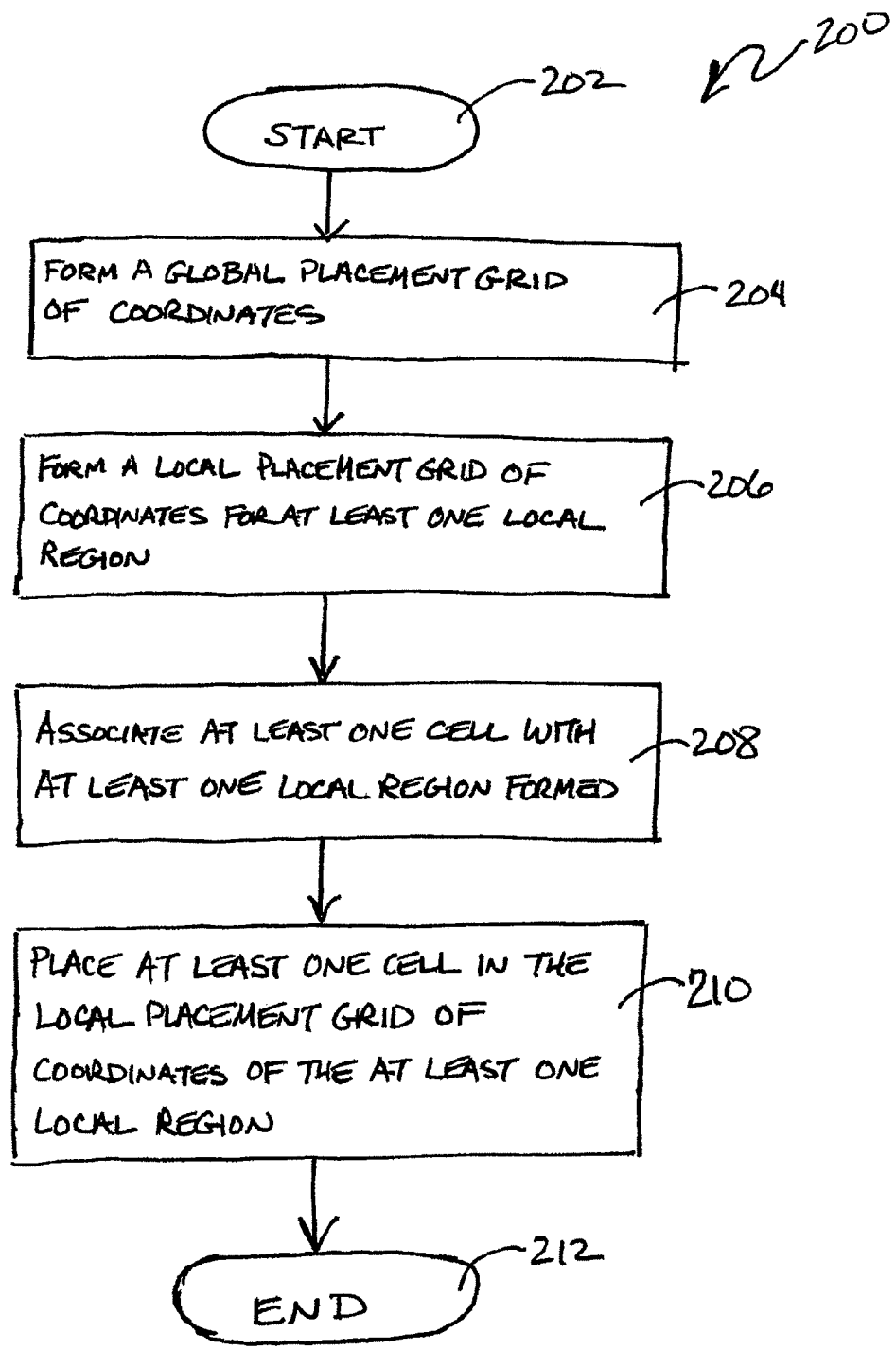
FIG. 2 illustrates a method for placement of at least one cell in a digital integrated circuit layout according to various exemplary embodiments of the present invention.

FIG. 2 illustrates a flowchart of method 200 for placement of at lest one cell in a digital integrated circuit layout according to various embodiments of the present invention. The method starts at block 202 where the placement module (e.g., placement module 120 of FIG. 1) is invoked.

In block 204, the method forms a global placement grid of coordinates. These global coordinates are for an entire digital integrated circuit design layout. The global placement grid of coordinates may represent horizontal and vertical directions. The formation of the global coordinates may be facilitated by information from databases 116 of FIG. 1, where the dimensional size of a die for a digital integrated circuit can be stored, retrieved, and used for forming the global placement grid of coordinates. For example, specifications regarding dimensional dies sizes of ASICs, FPGAs, or other standard or pre-determined digital integrated circuit die sizes may be stored in and retrieved from databases 116 of computer system 100 by placement module 120.

In block 206 of FIG. 2, a local placement grid of coordinates is formed for at least one local region. The local placement grid of coordinates represent horizontal and vertical directions. Also, the at least one local region may be adapted to support non-integer multiple height rows. In addition, the local placement grid could accommodate standard cells of a particular height, or also support an integer number of rows of a predetermined height. The local region, and its local placement grid, can be associated or related with the global placement grid for the layout of the digital integrated circuit.

Figure 3:
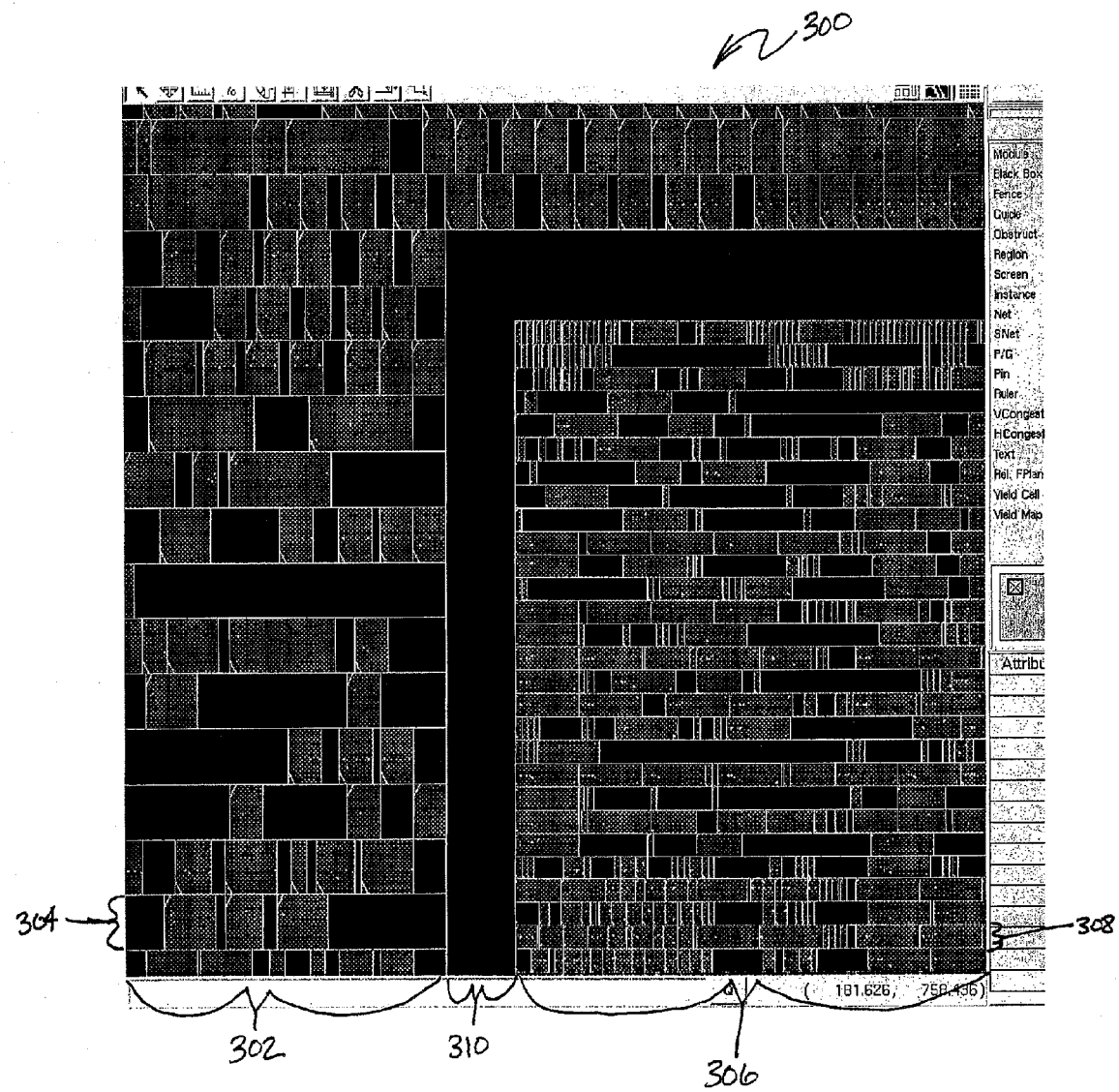
FIG. 3 illustrates a display screen of placed instances of different heights according to various exemplary embodiments of the present invention.

In block 208, the at least one cell may be associated with the at least one local region formed. The at least one cell can be placed in the local placement grid of coordinates of the local region at block 210. Thus, cells are assigned membership to a local region at block 208. The particular location of each cell within a local placement grid can be determined, and the cell may be accordingly placed in the determined grid location at block 210. For example, as illustrated in the exemplary display screen shot 300 of FIG. 3, local region 302 may have cells 304 with a particular row height. The cells of local region 302 may be from a particular library of database 116 of FIG. 1. Local region 306 may be a local region which is separate and distinct from local region 302, and local region 306 has cells 308 with a different row height than cells 304 of local region 302. Gap 310, as illustrated in FIG. 3, may separate local region 302 from local region 306. As local regions 302 and 306 may utilize cells from different libraries with different voltages, power levels, or other differing attributes, it is preferable to have a gap (e.g., gap 310) to separate the local regions and prevent current leakage or other related problems that may occur between various electronic devices with different properties.

In various embodiments of the present invention, there may be at least two local placement grids. A first local placement grid may be independent of a second local placement grid.

Figure 4:
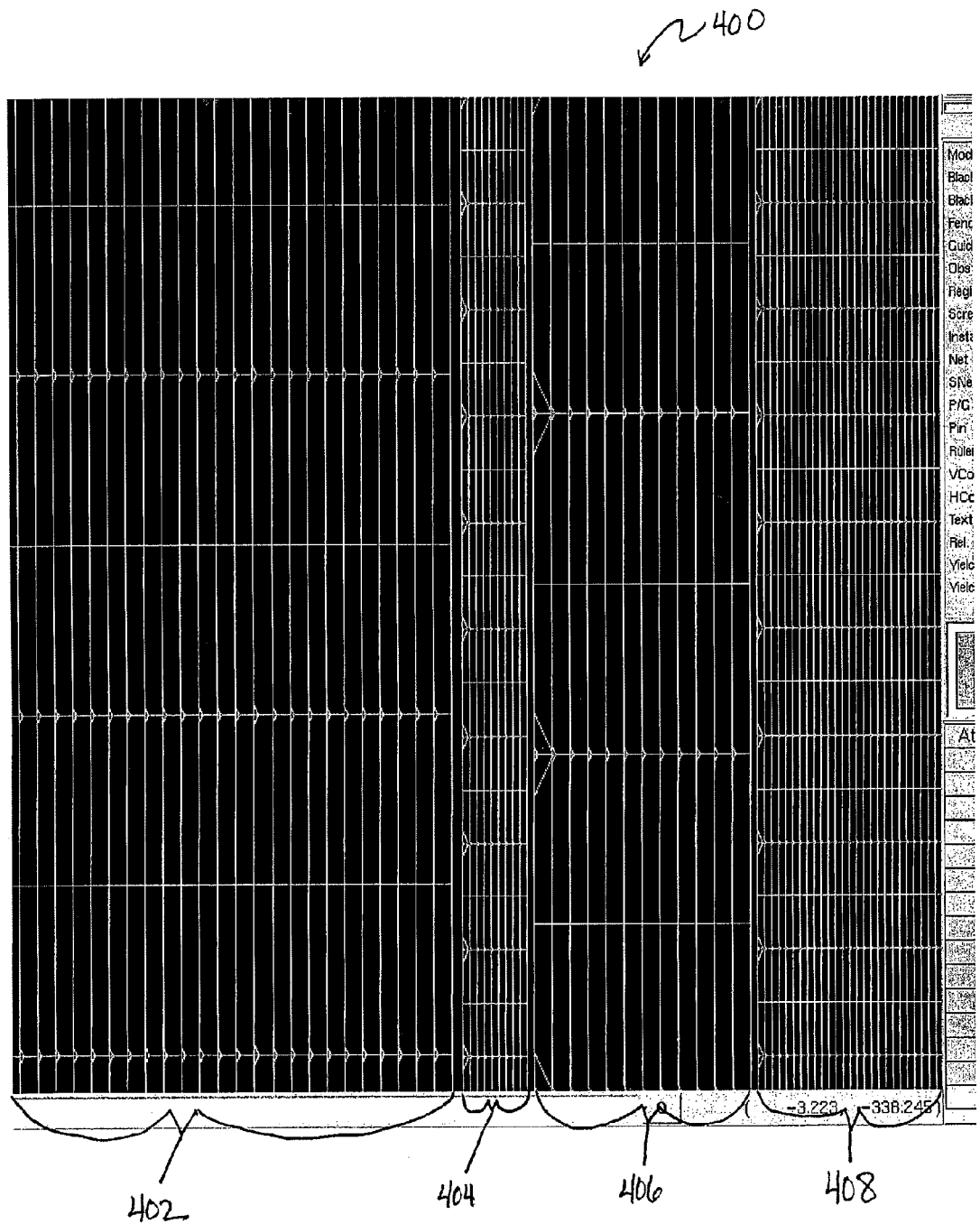
FIG. 4 illustrates a display screen of multiple placement grids, where the grids differ in height, width and offset according to various exemplary embodiments of the present invention.

The two grids may be independent of each other in terms of cell height, width, offset, or any other attribute, or any combination thereof, as illustrated in FIG. 4. Exemplary display screen 400 of FIG. 4 illustrates multiple local placement grids, each with different heights, widths, and offsets. Local region 402 has a greater row height than local region 406 that is adjacent to it. Local region 406 has a similar row height to local region 402, but the cells are offset in a vertical direction from the cells of local region 402. Additionally, there is vertical offset between the rows of local region 402 and the adjacent cells of local region 404. Similarly, the cells of local region 404 are similar in row height to the cells of local region 408, but there is vertical offset between the rows of local areas 404 and 408 and the local regions 402 and 406.

Furthermore, in various embodiments of the present invention, a first local cell may be placed in a local placement grid of a local region during the same session (including substantially simultaneously) with a second local cell which is placed in a different local placement region. The advantage of same session placement allows an operator of digital integrated circuit design layout system (e.g., computer system 100 of FIG. 1) not to have to end a session in order to work on different local regions which may utilize different libraries (and where the attributes of the components may be different in terms of voltage, power, etc.). The graphical user interface (e.g., user interface 104 of FIG. 1) can be updated to indicate placement of the local region within the global placement grid of coordinates, indicate the local placement grid of coordinates, or provide other related information.

The exemplary embodiments of the present invention provide various advantages related to flat NIMH legalization, where a complete digital integrated circuit (i.e., a whole chip, ASIC, FPGA, etc.) can be worked on as one entity during the same session. This helps simplify the design process for a digital integrated circuit, thus improving productivity. Also, by having a better understanding of the global resources, tighter constraints can be used for the design of the digital integrated circuit, thus helping reduce area, improve timing, reduce power, etc.

The detailed description set forth below in connection with the appended drawings is intended as a description of various embodiments of the invention and is not intended to represent the only embodiments in which the invention may be practiced. The detailed description includes specific details for the purpose of providing a thorough understanding of the invention. However, it will be apparent to those skilled in the art that the invention may be practiced without these specific details. In some instances, well known structures and components are shown in block diagram form in order to avoid obscuring the concepts of the invention.

It is understood that the specific order or hierarchy of blocks in the processes disclosed is an example of exemplary approaches. Based upon design preferences, it is understood that the specific order or hierarchy of blocks in the processes may be rearranged while remaining within the scope of the present disclosure. The accompanying method claims present elements of the various blocks in a sample order, and are not meant to be limited to the specific order or hierarchy presented.

The various illustrative logical blocks, modules, circuits, elements, and/or components described in connection with the embodiments disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing components, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

The previous description is provided to enable any person skilled in the art to practice the various embodiments described herein. Various modifications to these embodiments will be readily apparent to those skilled in the art, and the generic principles defined herein may be applied to other embodiments. Thus, the claims are not intended to be limited to the embodiments shown herein, but is to be accorded the full scope consistent with the language claims, wherein reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method for placement of at least one cell in a digital integrated circuit layout, comprising:

retrieving, from a computer readable medium, information regarding a digital integrated circuit;

forming, using a processor, a global placement grid of coordinates for the digital integrated circuit based on the information, wherein the coordinates represent horizontal and vertical directions;

forming a local placement grid of coordinates for at least one local region of the digital integrated circuit and another local placement grid of coordinates for another local region of the digital integrated circuit, wherein each of the local placement grid of coordinates and the other local placement grid of coordinates represents horizontal and vertical directions, wherein each of the at least one local region and the other local region is adapted to support non-integer multiple height rows, and wherein the local placement grid of coordinates is independent in height and width from the other local placement grid of coordinates; and associating the at least one cell with the at least one local region formed.

2. The method of claim 1, further comprising placing the at least one cell in the local placement grid of coordinates of the at least one local region.

3. The method of claim 1, wherein the local placement grid is further independent of the other local placement grid in offset.

4. The method of claim 1, further comprising placing a first cell in a first local region and a second cell in a second local region during the same session, including substantially simultaneously.

5. The method of claim 4, wherein the first cell and the second cell comprise cells from different cell libraries.

6. A computer program product, comprising a computer-readable medium for storing programs for execution by one or more computer systems, the computer program product comprising:
   a module for placement of at least one cell in a digital integrated circuit layout, wherein the module is used in conjunction with at least a microprocessor unit, a memory, and a user interface, and the module includes one or more computer programs containing instructions for:
      forming a global placement grid of coordinates for the digital integrated circuit based on information regarding the digital integrated circuit retrieved from a computer readable medium, wherein the coordinates represent horizontal and vertical directions;
      forming a local placement grid of coordinates for at least one local region of the digital integrated circuit and another local placement grid of coordinates for another local region of the digital integrated circuit, wherein each of the local placement grid of coordinates and the other local placement grid of coordinates represents horizontal and vertical directions, wherein each of the at least one local region and the other local region is adapted to support non-integer multiple height rows, and wherein the local placement grid of coordinates is independent in height and width from the other local placement grid of coordinates; and
      associating the at least one cell with the at least one local region formed.

7. The computer program product of claim 6, further comprising placing the at least one cell in the local placement grid of coordinates of the at least one local region.

8. The computer program product of claim 6, wherein the local placement grid is further independent of the other local placement grid in offset.

9. The computer program product of claim 6, further comprising placing a first cell in a first local region and a second cell in a second local region during the same session, including substantially simultaneously.

10. The computer program product of claim 9, wherein the first cell and the second cell comprise cells from different cell libraries.

11. A system for placement of at least one cell in a digital integrated circuit layout, comprising:
   at least one processing unit for executing computer programs;
   a graphical-user-interface for viewing representations of the digital integrated circuit on a display and observing the layout of the integrated circuit;
   a memory for storing databases of the digital integrated circuit;
   means for forming a global placement grid of coordinates for the digital integrated circuit based on information regarding the digital integrated circuit retrieved from a computer readable medium, wherein the coordinates represent horizontal and vertical directions;
   means for forming a local placement grid of coordinates for at least one local region of the digital integrated circuit and another local placement grid of coordinates for another local region of the digital integrated circuit, wherein each of the local placement grid of coordinates and the other local placement grid of coordinates represents horizontal and vertical directions, wherein each of the at least one local region and the other local region is adapted to support non-integer multiple height rows, and wherein the local placement grid of coordinates is independent in height and width from the other local placement grid of coordinates; and
   means for associating the at least one cell with the at least one local region formed.

12. The system of claim 11, further comprising means for placing the at least one cell in the local placement grid of coordinates of the at least one local region.

13. The system of claim 11, wherein the local placement grid is further independent of the other local placement grid in offset.

14. The system of claim 11, further comprising means for placing a first cell in a first local region and a second cell in a second local region during the same session, including substantially simultaneously.

15. The system of claim 14, wherein the first cell and the second cell comprise cells from different cell libraries.

* * * * *